(12) United States Patent
Inaba

(10) Patent No.: US 8,760,234 B2
(45) Date of Patent: Jun. 24, 2014

(54) MEMS VIBRATOR AND OSCILLATOR

(75) Inventor: Shogo Inaba, Shiojiri (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 13/550,950

(22) Filed: Jul. 17, 2012

(65) Prior Publication Data

US 2013/0027146 A1 Jan. 31, 2013

(30) Foreign Application Priority Data

Jul. 27, 2011 (JP) ................................ 2011-164378

(51) Int. Cl.
*H03B 5/30* (2006.01)

(52) U.S. Cl.
USPC ........... 331/154; 331/156; 310/348; 310/367; 310/370

(58) Field of Classification Search
USPC ................. 331/154–156; 310/348, 367, 370
See application file for complete search history.

(56) References Cited

U.S. PATENT DOCUMENTS

| 7,009,747 | B2 | 3/2006 | Hara et al. |
| 7,173,748 | B2 | 2/2007 | Hara et al. |
| 7,705,693 | B2 | 4/2010 | Davis |
| 7,816,841 | B2 | 10/2010 | Kawakubo et al. |
| 8,026,120 | B2 | 9/2011 | Kihara et al. |
| 2009/0315646 | A1* | 12/2009 | Watanabe .................. 333/186 |
| 2011/0306153 | A1 | 12/2011 | Kihara et al. |

FOREIGN PATENT DOCUMENTS

| JP | 2002-267956 | 9/2002 |
| JP | 2007-152501 | 6/2007 |
| JP | 2008-213057 | 9/2008 |
| JP | 2009-016161 | 1/2009 |
| JP | 2009-051005 | 3/2009 |
| JP | 2009-055683 | 3/2009 |
| JP | 2010-162629 | 7/2010 |

* cited by examiner

*Primary Examiner* — Joseph Chang
*Assistant Examiner* — Jeffrey Shin
(74) *Attorney, Agent, or Firm* — Harness, Dickey & Pierce, P.L.C.

(57) ABSTRACT

A MEMS vibrator includes: a substrate; a first electrode disposed above the substrate; and a second electrode disposed in a state where at least one portion of the second electrode has a space between the first electrode and the second electrode, and having a beam portion capable of vibrating, in the thickness direction of the substrate, with electrostatic force and a supporting portion supporting one edge of the beam portion and disposed above the substrate, wherein a supporting side face of the supporting portion supporting the one edge has a bending portion which bends in plan view from the thickness direction of the substrate, and the one edge is supported by the supporting side face including the bending portion.

6 Claims, 9 Drawing Sheets

| | PRIMARY VIBRATION (MHz) | SECONDARY VIBRATION 1 (MHz) | SECONDARY VIBRATION 2 (MHz) |
|---|---|---|---|
| MODEL M1 | 25.79 | 29.13 | 38.02 |
| MODEL M2 | 25.64 | 26.87 | 30.62 |
FIG. 5
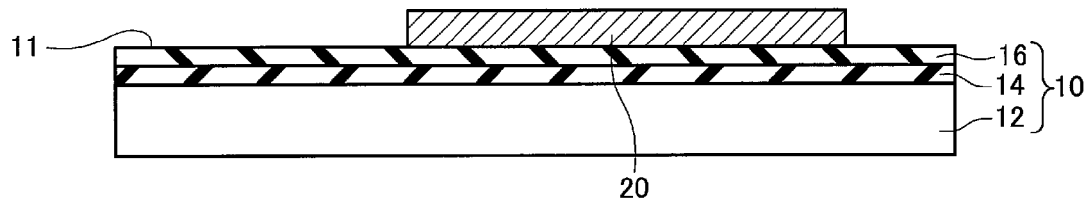
FIG. 6
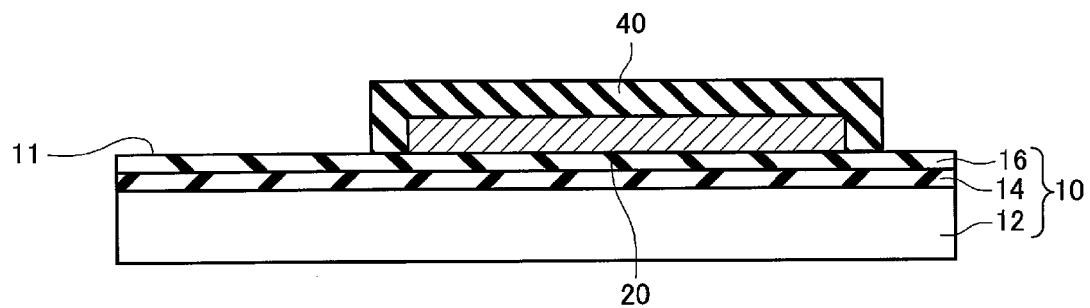
FIG. 7

US 8,760,234 B2

MEMS VIBRATOR AND OSCILLATOR

BACKGROUND

1. Technical Field

The present invention relates to a MEMS vibrator and an oscillator.

2. Related Art

MEMS (Micro Electro Mechanical Systems) are one of techniques for forming a minute structure.

JP-A-2010-162629 discloses a MEMS vibrator having a fixed electrode and a movable electrode, in which a cantilever movable electrode is driven by electrostatic force generated between the electrodes. An output of such a cantilever electrostatic MEMS vibrator is generated by a change in capacitance between the fixed electrode and the movable electrode when driven. Therefore, the larger the crossing area of the fixed electrode and the movable electrode (the area of a region where the electrodes overlap each other) is, the higher the output is.

On the other hand, a driving frequency is a natural frequency of a vibrator, and determined by the shape and dimensions of the vibrator. Various shapes of MEMS vibrators driven in a frequency band from several kHz to several GHz have been proposed so far. In the case of the MEMS vibrator having a cantilever structure disclosed in JP-A-2010-162629, the driving frequency is determined by the length and thickness of a beam portion (movable electrode). When the thickness is constant, the great length of the beam portion makes the frequency low, and the small length makes the frequency high.

In this manner, since the frequency of the MEMS vibrator depends on the shape of its beam portion, high processing accuracy is required in manufacturing processes of the MEMS vibrator.

However, in the manufacturing processes of the MEMS vibrator, since the fixed electrode and the movable electrode are formed in different processes, an error occurs in a positional relation between them. That is, since an error occurs in the beam length and the crossing area, a desired frequency cannot be obtained in some cases, making the frequency accuracy low.

SUMMARY

An advantage of some aspects of the invention is to provide a MEMS vibrator having high frequency accuracy. Moreover, another advantage of some aspects of the invention is to provide an oscillator including the MEMS vibrator.

A MEMS vibrator according to an aspect of the invention includes: a substrate; a first electrode disposed above the substrate; and a second electrode disposed in a state where at least one portion of the second electrode has a space between the first electrode and the second electrode, and having a beam portion capable of vibrating, in the thickness direction of the substrate, with electrostatic force and a supporting portion supporting one edge of the beam portion and disposed above the substrate, wherein a supporting side face of the supporting portion supporting the one edge has a bending portion which bends in plan view from the thickness direction of the substrate, and the one edge is supported by the supporting side face including the bending portion.

According to the MEMS vibrator, the rigidity of the beam portion can be increased. With this configuration, the beam length of a cantilever beam portion required for obtaining a desired frequency can be increased, compared to the case where the supporting side face does not have the bending portion. Accordingly, a manufacturing error rate of a beam forming position in manufacture for the beam length can be reduced, so that a frequency shift can be reduced. Accordingly, the frequency accuracy can be increased.

It is noted that, in the descriptions concerning the invention, the term "above" may be used, for example, in a manner as "a specific element (hereafter referred to as "A") is formed "above" another specific element (hereafter referred to as "B")." In the descriptions concerning the invention, in the case of such an example, the term "above" is used, while assuming that it includes a case in which A is formed directly on B, and a case in which A is formed above B through another element.

In the MEMS vibrator according to the aspect of the invention, the bending portion may have a shape of an arc in plan view from the thickness direction of the substrate.

According to the MEMS vibrator, the rigidity of the beam portion can be further increased, compared to a bending portion which includes a straight line like an L-shape. With this configuration, the length of the beam portion required for obtaining a desired frequency can be increased, compared to the case where the supporting side face does not have the bending portion. Accordingly, the manufacturing error rate for the length of the beam portion can be reduced, so that the frequency shift due to the manufacturing error can be reduced.

In the MEMS vibrator according to the aspect of the invention, the one edge may have a shape of an arc having a first radius in plan view from the thickness direction of the substrate, and the other edge of the beam portion may have a shape of an arc having a second radius smaller than the first radius in plan view from the thickness direction of the substrate.

According to the MEMS vibrator, a secondary vibration frequency can be away from a primary vibration frequency as will be described later. Accordingly, a secondary vibration can be suppressed.

In the MEMS vibrator according to the aspect of the invention, the first electrode may have a first side face facing the supporting side face of the supporting portion, and a second side face located on the side opposite to the first side face and having a shape along the first side face, the first side face may have a shape of an arc having a third radius smaller than the first radius and larger than the second radius in plan view from the thickness direction of the substrate, and the second side face may have a shape of an arc having a fourth radius smaller than the second radius in plan view from the thickness direction of the substrate.

According to the MEMS vibrator, compared to the case where the first side face and the second side face do not have a shape of an arc, the area of the first electrode can be reduced while maintaining the crossing area of the first electrode and the second electrode (the area of a region where the electrodes overlap each other). Accordingly, a parasitic capacitance between the first electrode and the substrate can be reduced.

In the MEMS vibrator according to the aspect of the invention, the first electrode may have the first side face facing the supporting side face of the supporting portion, and the first side face may have a shape along the supporting side face of the supporting portion.

In the MEMS vibrator according to the aspect of the invention, the supporting side face of the supporting portion may further have a linear portion in plan view from the thickness direction of the substrate.

According to the MEMS vibrator, the rigidity of the beam portion can be increased. With this configuration, the length of the beam portion required for obtaining a desired frequency can be increased, compared to the case where the supporting side face does not have the bending portion. Accordingly, the manufacturing error rate for the length of the beam portion can be reduced, so that the frequency shift due to the manufacturing error can be reduced.

An oscillator according to another aspect of the invention includes: the MEMS vibrator according to the aspect of the invention, and a circuit portion electrically connected to the first electrode and the second electrode of the MEMS vibrator.

According to the oscillator, since the MEMS vibrator according to the aspect of the invention is included, signals having high frequency accuracy can be output.

BRIEF DESCRIPTION OF THE DRAWINGS

The invention will be described with reference to the accompanying drawings, wherein like numbers reference like elements.

FIG. 5 is a table showing results of simulations of the model M1 and the model M2.

FIG. 6 is a cross-sectional view schematically showing a manufacturing process of the MEMS vibrator according to the first embodiment.

FIG. 7 is a cross-sectional view schematically showing the manufacturing process of the MEMS vibrator according to the first embodiment.

DESCRIPTION OF EXEMPLARY EMBODIMENTS

Hereinafter, preferred embodiments of the invention will be described in detail using the drawings. The embodiments described below do not unduly limit the contents of the invention set forth in the appended claims. Moreover, not all of the configurations described below may necessarily be essential configuration requirements of the invention.

1. First Embodiment 1. 1. MEMS Vibrator

Figure 1:
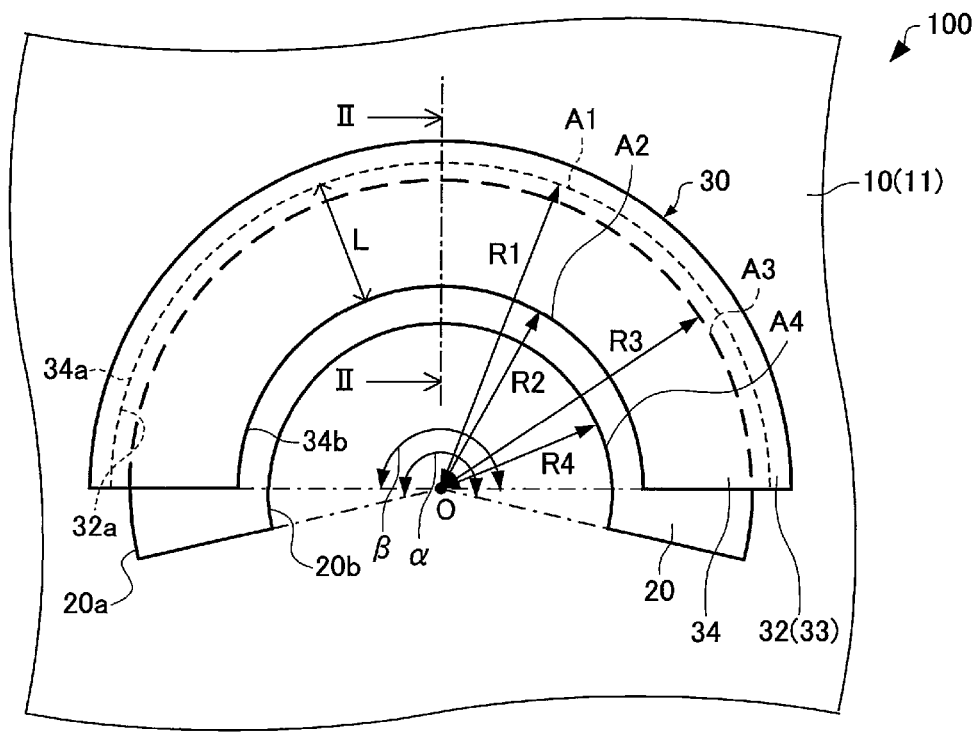
FIG. 1 is a plan view schematically showing a MEMS vibrator according to a first embodiment.
Figure 2:
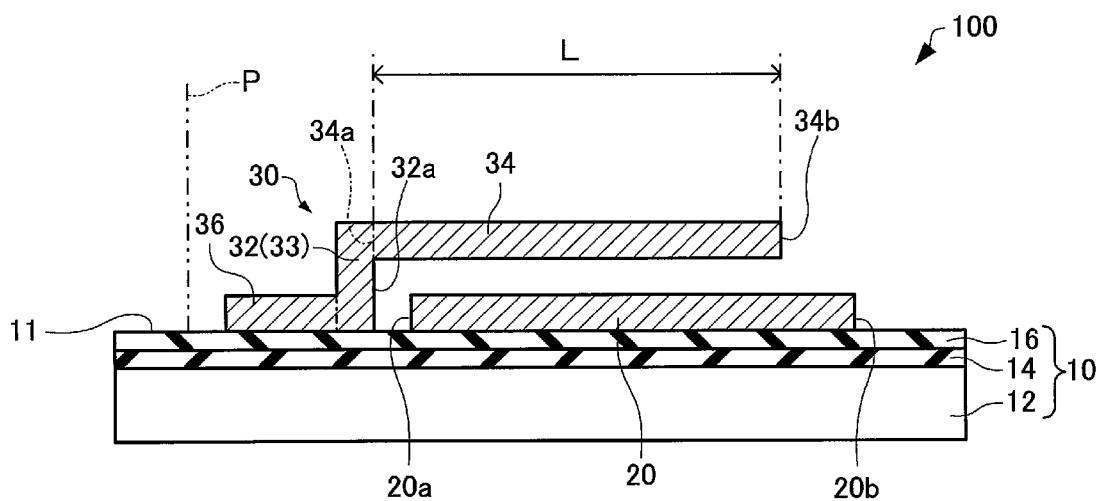
FIG. 2 is a cross-sectional view schematically showing the MEMS vibrator according to the first embodiment.

First, a configuration of a MEMS vibrator according to a first embodiment will be described with reference to the drawings. FIG. 1 is a plan view schematically showing a MEMS vibrator 100 according to the first embodiment. FIG. 2 is a cross-sectional view schematically showing the MEMS vibrator 100. FIG. 2 is the cross-sectional view taken along line II-II of FIG. 1. In FIG. 1, the illustration of a fixing portion 36 of a second electrode 30 is omitted for convenience sake.

As shown in FIGS. 1 and 2, the MEMS vibrator 100 includes a substrate 10, a first electrode 20, and the second electrode 30.

As shown in FIG. 2, the substrate 10 can have a supporting substrate 12, a first under layer 14, and a second under layer 16.

As the supporting substrate 12, a semiconductor substrate such as a silicon substrate, for example, can be used. As the supporting substrate 12, various types of substrates such as a ceramics substrate, a glass substrate, a sapphire substrate, a diamond substrate, or a synthetic resin substrate may be used.

The first under layer 14 is formed on the supporting substrate 12. As the first under layer 14, a trench insulating layer, a LOCOS (Local Oxidation of Silicon) insulating layer, a semi-recessed LOCOS insulating layer, or the like, for example, can be used. The first under layer 14 can electrically isolate the MEMS vibrator 100 from another element (not shown) formed in the supporting substrate 12.

The second under layer 16 is formed on the first under layer 14. A material of the second under layer 16 is silicon nitride, for example. The second under layer 16 can function as an etching stopper layer in a release etching process described later.

The first electrode 20 is disposed on the substrate 10. The first electrode 20 has a first side face 20a and a second side face 20b. The thickness (size in a direction along a normal P) of the first electrode 20 is, for example, from 0.1 μm to 100 μm.

As shown in FIG. 2, the first side face 20a faces a side face 32a of a supporting portion 32 of the second electrode 30, and has a shape along the side face 32a of the supporting portion 32. Specifically as shown in FIG. 1, in plan view from the thickness direction of the substrate 10 (as viewed from a direction of the normal P of a surface 11 of the substrate 10), the side face 32a of the supporting portion 32 has a shape of an arc (hereinafter referred to as "arc A1") having a first radius R1. The first side face 20a has a shape of an arc (hereinafter referred to as "arc A3") having a third radius R3 so that the first side face 20a is along the side face 32a of the supporting portion 32. The third radius R3 is smaller than the first radius R1. The arc A3 is a concentric arc having a common center O with the arc A1. A central angle β of the arc A1 is, for example, 180°, while a central angle α of the arc A3 is, for example, 180° or more.

The second side face 20b is located on the side opposite to the first side face 20a, and has a shape along the first side face 20a. In the illustrated example, the second side face 20b has, in plan view from the thickness direction of the substrate 10 as shown in FIG. 1, a shape of an arc (hereinafter referred to as "arc A4") having a fourth radius R4. The fourth radius R4 is smaller than the third radius R3. The arc A4 is, for example, a concentric arc having the common center O with the arc A3. The arc A4 has, for example, the same central angle α as that of the arc A3.

The planar shape (shape as viewed from the thickness direction of the substrate 10) of the first electrode 20 is, as shown in FIG. 1, a shape obtained by removing a fan-shaped region surrounded by the arc A4 and two radii connecting respective end points of the arc A4 with the center O, from a fan-shaped region surrounded by the arc A3 and two radii connecting respective end points of the arc A3 with the center O.

The second electrode 30 is formed spaced apart from the first electrode 20. The second electrode 30 has the supporting portion 32 fixed on the substrate 10, a beam portion 34 disposed to face the first electrode 20, and the fixing portion 36 fixing the supporting portion 32 on the substrate 10.

The supporting portion 32 is disposed on the substrate 10. The supporting portion 32 is fixed to the substrate 10. The supporting portion 32 supports the beam portion 34. In the illustrated example, the second electrode 30 is formed in a cantilevered manner. The supporting portion 32 has a bending portion 33.

The bending portion 33 bends in plan view from the thickness direction of the substrate 10 as shown in FIG. 1. In the MEMS vibrator 100, the entire portion of the supporting portion 32 is the bending portion 33. In the illustrated example, the bending portion 33 has, in plan view from the thickness direction of the substrate 10, a shape of an arc. The planar shape of the bending portion 33 is not limited to the shape of an arc, but may be like, for example, an elliptical arc, a cycloid, a sine curve, or a parabola.

The supporting portion 32 has the side face (supporting side face) 32a. The side face 32a of the supporting portion 32 supports one edge of the beam portion 34. The side face 32a of the supporting portion 32 (the bending portion 33) has, as shown in FIG. 1, a bending portion which bends in plan view from the thickness direction of the substrate 10. Therefore, a first face 34a which constitutes the one edge of the beam portion 34 in contact with the side face 32a of the supporting portion 32 also bends, in plan view from the thickness direction of the substrate 10, similarly to the side face 32a of the supporting portion 32.

The beam portion 34 is disposed in a state where at least one portion thereof has a space between the beam portion 34 and the first electrode 20. The beam portion 34 is formed above the first electrode 20 with a predetermined gap between the beam portion 34 and the first electrode 20. The beam portion 34 extends from the bending portion 33 of the supporting portion 32. In the illustrated example, the beam portion 34 extends from the bending portion 33 of the supporting portion 32 toward the center O. The one edge of the beam portion 34 is supported by the supporting side face 32a. The beam portion 34 has the first face 34a constituting the one edge of the beam portion 34, and a second face 34b constituting the other edge of the beam portion 34.

The first face 34a is a face contacting the supporting portion 32. In the illustrated example, the first face 34a is in contact with the side face 32a of the supporting portion 32. That is, the first face 34a is formed along the side face 32a of the supporting portion 32. The first face 34a has a shape of the arc A1 having the first radius R1 in plan view from the thickness direction of the substrate 10. That is, the one edge of the beam portion 34 has, in plan view from the thickness direction of the substrate 10, the shape of the arc A1 having the first radius R1.

The second face 34b is located on the side opposite to the first face 34a, and has a shape along the first face 34a. The second face 34b is located at a tip of the beam portion 34. In the illustrated example, the second face 34b has, in plan view from the thickness direction of the substrate 10 as shown in FIG. 1, a shape of an arc (hereinafter referred to as "arc A2") having a second radius R2. The second radius R2 is smaller than the first radius R1. That is, the other edge of the beam portion 34 has a shape of the arc A2 having the second radius R2 smaller than the first radius R1 in plan view from the thickness direction of the substrate 10. The arc A2 is, for example, a concentric arc having the common center O with the arc A1. The arc A2 has the same central angle β as that of the arc A1.

As shown in FIG. 1, the planar shape of the beam portion 34 is a shape obtained by removing a semicircular region surrounded by the arc A2 and two radii connecting respective end points of the arc A2 with the center O, from a semicircular region surrounded by the arc A1 and two radii connecting respective end points of the arc A1 with the center O. A length L of the beam portion 34, that is, a distance between the first face 34a and the second face 34b of the beam portion 34 in the radial direction is constant. The term "radial direction" of the beam portion 34 used herein means a direction from the center O toward any point on the arc A1. The beam portion 34 is reduced in size (length of the arc) in a direction along the arcs A1 and A2, from the first face 34a on the supporting portion 32 side toward the second face 34b on the tip side of the beam portion 34, in plan view from the thickness direction of the substrate 10. That is, the beam portion 34 has, in plan view from the thickness direction of the substrate 10 as shown in FIG. 1, a shape narrowing from the supporting portion 32 side toward the tip side of the beam portion 34.

The thickness (size in the thickness direction of the substrate 10) of the second electrode 30 is constant, for example. That is, the thickness of the second electrode 30 is the same from the first face 34a on the supporting portion 32 side to the second face 34b on the tip side as shown in FIG. 2.

The arcs A1, A2, A3, and A4 are, for example, concentric arcs having the common center O. The radius (first radius) R1 of the arc A1 is, for example, larger than the other radii R2, R3, and R4 of the arcs A2, A3, and A4. The radius (second radius) R2 of the arc A2 is, for example, smaller than the radius R3 and larger than the radius R4. The radius (third radius) R3 of the arc A3 is, for example, smaller than the radius R1 and larger than the radius R2. The radius (fourth radius) R4 of the arc A4 is, for example, smaller than the other radii R1, R2, and R3 of the arcs A1, A2, and A3.

The material of the first electrode 20 and the second electrode 30 is, for example, polycrystalline silicon doped with a predetermined impurity to provide conductivity. When a voltage is applied between the first electrode 20 and the second electrode 30, the beam portion 34 can be vibrated by electrostatic force generated between the electrodes 20 and 30. The first electrode 20 and the fixing portion 36 of the second electrode 30 can be connected to wiring (not shown) for applying the voltage between the electrodes 20 and 30.

The fixing portion 36 fixes the supporting portion 32 on the substrate 10. Wiring (not shown) for applying a voltage to the second electrode 30 may be electrically connected to the fixing portion 36. The shape of the fixing portion 36 is not particularly limited as long as the supporting portion 32 can be fixed on the substrate 10.

Although not shown in the drawing, the MEMS vibrator 100 may have a covering structure which airtightly seals the first electrode 20 and the second electrode 30 in a reduced-pressure state. With this configuration, it is possible to reduce the air resistance of the beam portion 34 during its vibration.

The MEMS vibrator 100 has the following features, for example.

In the MEMS vibrator 100, the supporting portion 32 of the second electrode 30 has the bending portion 33 which bends in plan view from the thickness direction of the substrate 10, and the beam portion 34 of the second electrode 30 extends from the bending portion 33. In other words, the side face 32a of the supporting portion 32 of the second electrode 30 has the bending portion which bends in plan view from the thickness direction of the substrate 10, and the one edge of the beam portion 34 is supported by the side face 32a of the supporting portion 32. With this configuration, the rigidity of the beam portion 34 can be increased. Accordingly, the length L of the beam portion 34 required for obtaining a desired frequency can be increased, compared to the case where the supporting portion does not have the bending portion. Therefore, an error rate of a beam forming position in manufacture for the length L of the beam portion 34 can be reduced, so that a frequency shift can be reduced. Accordingly, the frequency accuracy can be increased. Hereinafter, a description will be made in detail.

In the case of a MEMS vibrator having a cantilever structure, a driving frequency is determined by the length and thickness of its beam portion (movable electrode). When the thickness is constant, the great length of the beam portion makes the frequency low, and the small length makes the frequency high. When the length and thickness of the beam portion are constant, the high rigidity of the beam portion makes the frequency high. Therefore, when the same frequency is obtained, the length of the beam portion can be increased in a vibrator having a beam portion with high rigidity, compared to a vibrator having a beam portion with low rigidity. Since a manufacturing error rate for the length of the beam portion is reduced if the length of the beam portion can be increased, a frequency shift due to the manufacturing error can be reduced. In the MEMS vibrator 100 as described above, since the supporting portion 32 has the bending portion 33, the rigidity of the beam portion 34 can be increased, compared to the case where the supporting portion does not have the bending portion (for example, the case where the supporting portion is formed linearly in plan view from the thickness direction of the substrate). Accordingly, the manufacturing error rate for the length L of the beam portion 34 can be reduced, so that the frequency shift due to the manufacturing error can be reduced.

In the MEMS vibrator 100, the beam portion 34 has the first face 34a contacting the supporting portion 32, and the second face 34b located on the side opposite to the first face 34a and having a shape along the first face 34a. The first face 34a has the shape of the arc A1 having the first radius R1 in plan view from the thickness direction of the substrate 10, and the second face 34b has the shape of the arc A2 having the second radius R2 smaller than the first radius R1 in plan view from the thickness direction of the substrate 10. In other words, the one edge of the beam portion 34 has the shape of the arc A1 having the first radius R1 in plan view from the thickness direction of the substrate 10, and the other edge of the beam portion 34 has the shape of the arc A2 having the second radius R2 smaller than the first radius R1 in plan view from the thickness direction of the substrate 10. With this configuration, a secondary vibration frequency can be away from a primary vibration frequency. The term "secondary vibration" used herein means a vibration which the MEMS vibrator has other than a primary vibration (required vibration). When the secondary vibration frequency is close to the primary vibration frequency, oscillations occur at an unintended frequency, making it impossible to obtain a desired frequency characteristic. In the MEMS vibrator 100, since the secondary vibration frequency can be away from the primary vibration frequency, the secondary vibration can be suppressed. The reasons will be described in an experimental example described later.

In the MEMS vibrator 100, the first electrode 20 has the first side face 20a facing the side face 32a of the supporting portion 32, and the second side face 20b located on the side opposite to the first side face 20a and having the shape along the first side face 20a. The first side face 20a has the shape of the arc A3 having the third radius R3 smaller than the first radius R1 and larger than the second radius R2 in plan view from the thickness direction of the substrate 10. The second side face 20b has the shape of the arc A4 having the fourth radius R4 smaller than the second radius R2 in plan view from the thickness direction of the substrate 10. With this configuration, while maintaining the crossing area of the first electrode 20 and the second electrode 30 (the area of the region where the electrodes overlap each other), the area of the first electrode 20 (the size of the first electrode 20 as viewed from the thickness direction of the substrate 10) can be reduced. Accordingly, a parasitic capacitance between the first electrode 20 and the substrate 10 can be reduced.

In the MEMS vibrator 100, the beam portion 34 of the second electrode 30 has, in plan view from the thickness direction of the substrate 10 as shown in FIG. 1, the shape narrowing from the first face 34a on the supporting portion 32 side toward the second face 34b on the tip side. With this configuration, since force in the compression direction is applied to the beam portion 34 in vibrations, force in a direction in which crystal grains of polysilicon constituting the second electrode 30 are in close contact with each other is applied to the crystal grains. Accordingly, the strength of the beam portion 34 in vibrations can be increased, so that the reliability can be improved.

In the MEMS vibrator 100 as described above, the bending portion 33 is provided in the supporting portion 32 of the second electrode 30, whereby the rigidity of the beam portion 34 can be increased to reduce the frequency shift due to the manufacturing error. Accordingly, in the manufacturing processes for example, a process of adjusting the frequency of the beam portion 34 becomes unnecessary, so that a desired frequency can be easily obtained with high accuracy.

1.2. Experimental Example of MEMS Vibrator

Next, an experimental example of the MEMS vibrator according to the first embodiment will be described with reference to the drawings. Specifically, simulation in a model M1 in which the MEMS vibrator 100 according to the embodiment is modeled will be described.

(1) Configuration of Model

Figure 3:
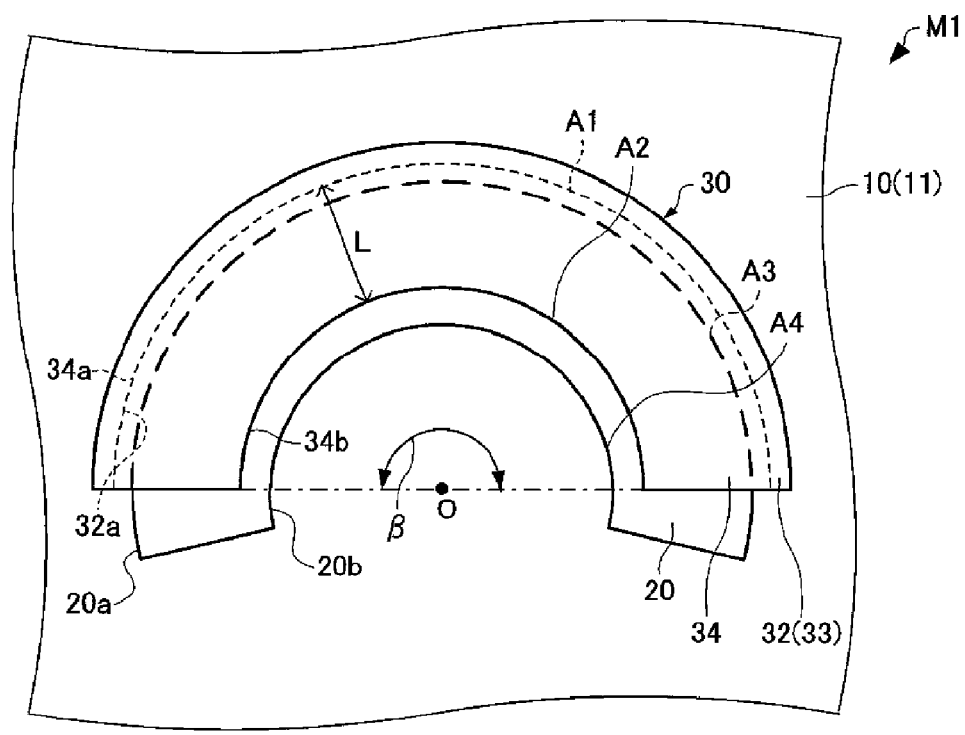
FIG. 3 is a plan view schematically showing a model M1.

FIG. 3 is a plan view schematically showing the model M1 used in the simulation. In the model M1, the first face 34a has the shape of the arc A1 having the first radius R1 in plan view from the thickness direction of the substrate 10, and the second face 34b has the shape of the arc A2 having the second radius R2 smaller than the first radius R1 as viewed from the thickness direction of the substrate 10. The arc A1 and the arc A2 are semicircles centered at the center O. In the model M1, the length L of the beam portion 34 is 4.0 µm, the central angle β is 180°, the radius of the arc A3 (a distance between the center O and the first side face 20a) is 9.95 µm, and the crossing area of the first electrode 20 and the second electrode 30 (the area of the region where the electrodes overlap each other) is 99.9 µm².

Figure 4:
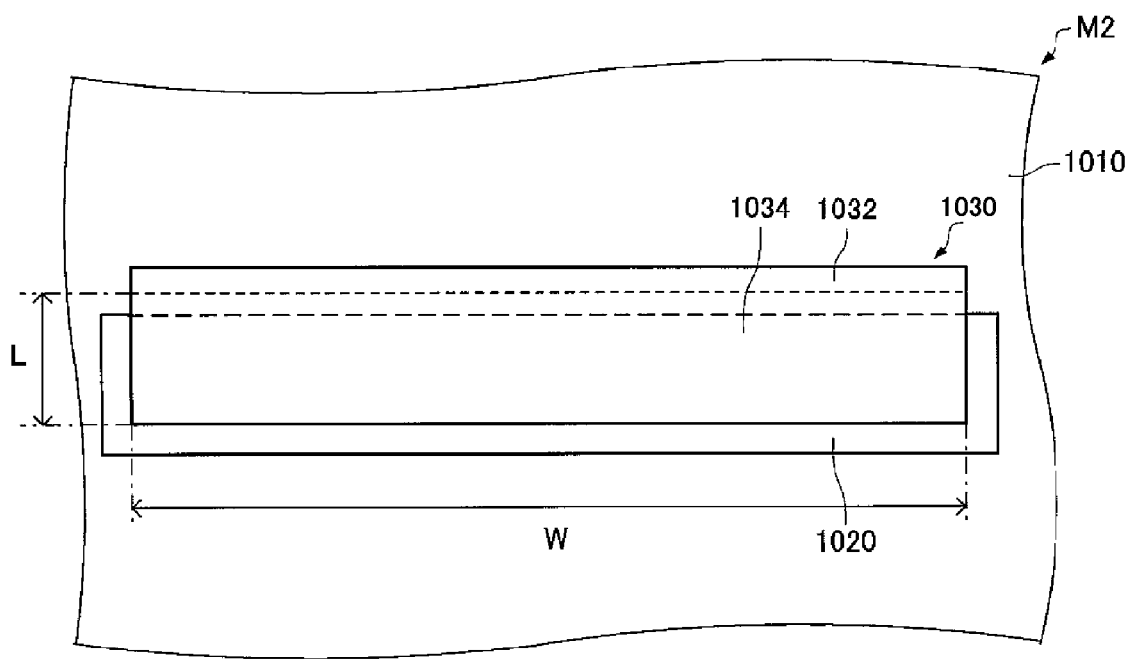
FIG. 4 is a plan view schematically showing a model M2.

FIG. 4 is a plan view schematically showing a model M2 used as a comparative example. In the model M2, a supporting portion 1032 does not have a bending portion, and the supporting portion 1032 is formed linearly in plan view from the thickness direction of a substrate 1010. A beam portion 1034 is a rectangle in plan view from the thickness direction of the substrate 1010. A length L of the beam portion 1034 is 3.788 μm, a width W of the beam portion 1034 is 30 μm, and the crossing area of a first electrode 1020 and a second electrode 1030 (the area of the region where the electrodes overlap each other) is 113.64 μm². The thickness of the beam portion is the same between the model M1 and the model M2. A material of the model M1 and the model M2 is silicon.

In each of the models M1 and M2 described above, primary vibration and secondary vibration frequencies were obtained.

(2) Simulation Results

FIG. 5 is a table showing the results of the simulations of the model M1 and the model M2. In FIG. 5, a secondary vibration 1 is a secondary vibration having a peak at a frequency closest to a primary vibration frequency, and a secondary vibration 2 is a secondary vibration having a peak at a frequency closest to the primary vibration frequency next to the secondary vibration 1.

As shown in FIG. 5, in the model M1, a difference between a primary vibration and the secondary vibration 1 is 3.34 MHz, and a difference between the primary vibration and the secondary vibration 2 is 12.23 MHz. In contrast to this, in the model M2, a difference between the primary vibration and the secondary vibration 1 is 1.24 MHz, and a difference between the primary vibration and the secondary vibration 2 is 4.98 MHz. In this manner, it is found that the secondary vibration frequencies are away from the primary vibration frequency in the model M1, compared to the model M2.

Accordingly, it is found in the MEMS vibrator 100 that the secondary vibration frequency can be away from the primary vibration frequency.

1.3. Manufacturing Method of MEMS Vibrator

Figure 8:
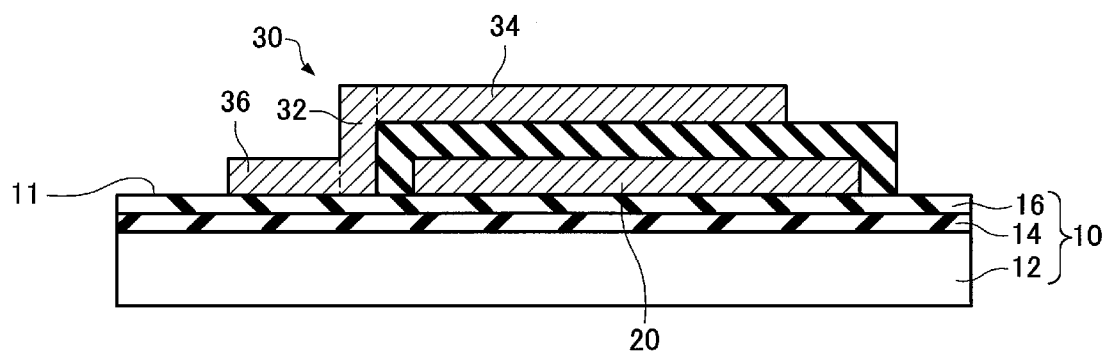
FIG. 8 is a cross-sectional view schematically showing the manufacturing process of the MEMS vibrator according to the first embodiment.

Next, a manufacturing method of the MEMS vibrator according to the embodiment will be described with reference to the drawings. FIGS. 6 to 8 are cross-sectional views schematically showing manufacturing processes of the MEMS vibrator 100 according to the embodiment.

As shown in FIG. 6, the first under layer 14 and the second under layer 16 are formed in this order on the supporting substrate 12 to obtain the substrate 10. The first under layer 14 is formed by, for example, an STI (Shallow Trench Isolation) method or a LOCOS method. The second under layer 16 is formed by, for example, a CVD (Chemical Vapor Deposition) method or a sputtering method.

Next, the first electrode 20 is formed on the substrate 10. More specifically, the first electrode 20 is formed by deposition by the CVD method, the sputtering method, or the like and then by patterning using a photolithographic technique and an etching technique. Next, the first electrode 20 formed of, for example, polycrystalline silicon is doped with a predetermined impurity (for example, boron) to provide conductivity.

As shown in FIG. 7, a sacrificial layer 40 is formed so as to cover the first electrode 20. The sacrificial layer 40 is formed by, for example, thermally oxidizing the first electrode 20. A material of the sacrificial layer 40 is, for example, silicon oxide. The thickness of the sacrificial layer 40 is, for example, from 0.01 μm to 100 μm. By the thickness of the sacrificial layer 40, a distance between the first electrode 20 and the beam portion 34 is determined.

As shown in FIG. 8, the second electrode 30 is formed on the sacrificial layer 40 and the substrate 10. More specifically, the second electrode 30 is formed by the deposition by the CVD method, the sputtering method, or the like and then by the patterning using the photolithographic technique and the etching technique. Next, the second electrode 30 formed of polycrystalline silicon is doped with a predetermined impurity (for example, boron) to provide conductivity. Through the processes described above, the second electrode 30 having the supporting portion 32, the beam portion 34, and the fixing portion 36 is formed. Since the second electrode 30 is formed on the sacrificial layer 40 having a constant film thickness, the side face 32a of the supporting portion 32 has the shape along the first side face 20a of the first electrode 20.

As shown in FIG. 2, the sacrificial layer 40 is removed (release etching process). The removal of the sacrificial layer 40 is performed by, for example, wet etching using hydrofluoric acid, buffered hydrofluoric acid (a mixed solution of hydrofluoric acid and ammonium fluoride), or the like. In the release etching process, the second under layer 16 can function as an etching stopper layer.

Through the processes described above, the MEMS vibrator 100 can be manufactured.

According to the manufacturing method of the MEMS vibrator 100, it is possible to form the MEMS vibrator 100 having high frequency accuracy as described above.

1.4. Modified Example of MEMS Vibrator

Figure 9:
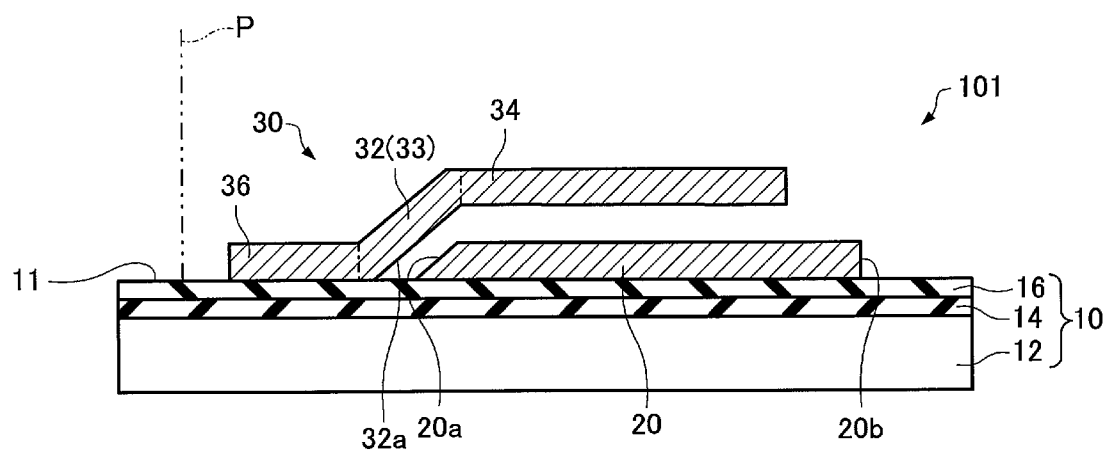
FIG. 9 is a cross-sectional view schematically showing a MEMS vibrator according to a modified example of the first embodiment.

Next, a MEMS vibrator according to a modified example of the first embodiment will be described with reference to the drawing. FIG. 9 is a cross-sectional view schematically showing a MEMS vibrator 101 according to the modified example of the first embodiment. FIG. 9 corresponds to FIG. 2. Hereinafter, in the MEMS vibrator 101 according to the modified example of the embodiment, members having functions similar to those of the constituent members of the MEMS vibrator 100 are denoted by the same reference numerals and signs, and the detailed descriptions thereof are omitted.

In the example of the MEMS vibrator 100 as shown in FIG. 2, the supporting portion 32 of the second electrode 30 is formed along the normal P. In contrast to this, in the MEMS vibrator 101 as shown in FIG. 9, the supporting portion 32 of the second electrode 30 is formed to be inclined with respect to the normal P from the substrate 10. In the illustrated example, an angle between the surface 11 of the substrate 10 and the side face 32a of the supporting portion 32 is an acute angle. Moreover, the first side face 20a of the first electrode 20 is formed along the side face 32a of the supporting portion 32, and inclined with respect to the normal P similarly to the side face 32a.

According to the MEMS vibrator 101, since the supporting portion 32 has the bending portion 33 similarly to the MEMS vibrator 100, the rigidity of the beam portion 34 can be increased. Accordingly, the manufacturing error rate for the length L of the beam portion 34 can be reduced, so that the frequency shift due to the manufacturing error can be reduced.

2. Second Embodiment

Figure 10:
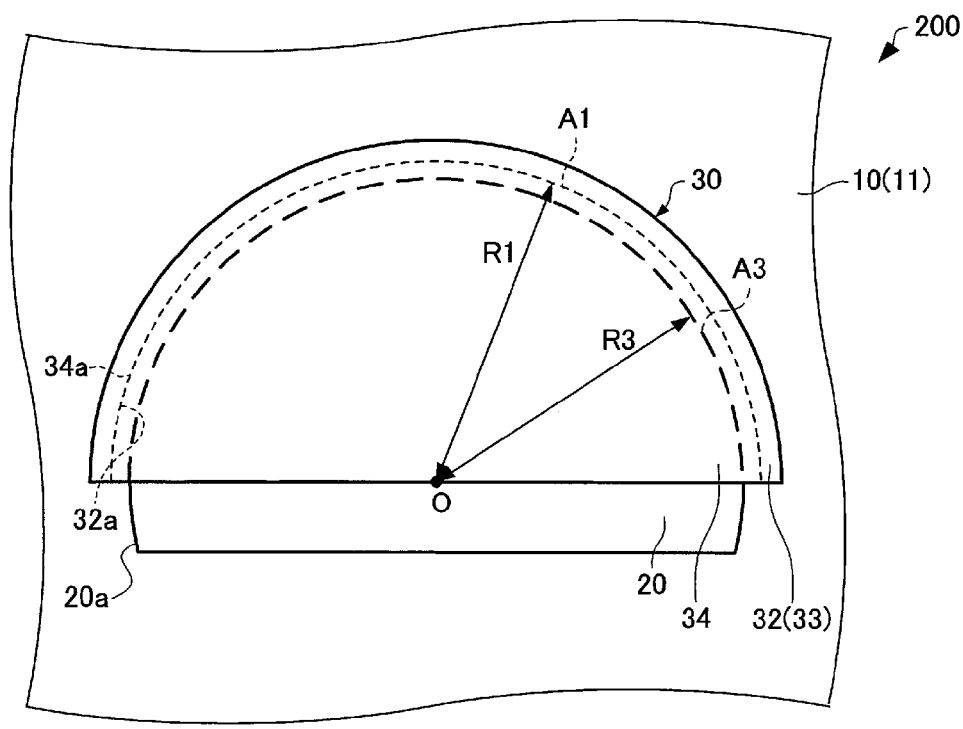
FIG. 10 is a plan view schematically showing a MEMS vibrator according to a second embodiment.

Next, a MEMS vibrator according to a second embodiment will be described with reference to the drawing. FIG. 10 is a plan view schematically showing a MEMS vibrator 200 according to the second embodiment. FIG. 10 corresponds to FIG. 1. In FIG. 10, the illustration of the fixing portion 36 of the second electrode 30 is omitted for convenience sake. Hereinafter, in the MEMS vibrator 200 according to the second embodiment, members having functions similar to those of the constituent members of the MEMS vibrator 100 are denoted by the same reference numerals and signs, and the detailed descriptions thereof are omitted.

In the MEMS vibrator 200, the planar shape of the second electrode 30 is a semicircular shape centered at the center O and having the radius R1. The first face 34a of the beam portion 34 has a semicircular shape in plan view from the thickness direction of the substrate 10. The first face 34a is in contact with the side face 32a of the supporting portion 32. The planar shape of the first electrode 20 is a shape including a region of a semicircular shape centered at the center O and having the radius R3 smaller than the radius R1. The first side face 20a of the first electrode 20 has, in plan view from the thickness direction of the substrate 10, a shape of an arc having the radius R3. A portion of the first side face 20a is formed along the first face 34a.

According to the MEMS vibrator 200, since the supporting portion 32 has the bending portion 33 similarly to the MEMS vibrator 100, the rigidity of the beam portion 34 can be increased. Accordingly, the manufacturing error rate for the length L of the beam portion 34 can be reduced, so that the frequency shift due to the manufacturing error can be reduced.

A manufacturing method of the MEMS vibrator 200 is similar to that of the MEMS vibrator 100 described above, and therefore, the description thereof is omitted.

3. Third Embodiment

Figure 11:
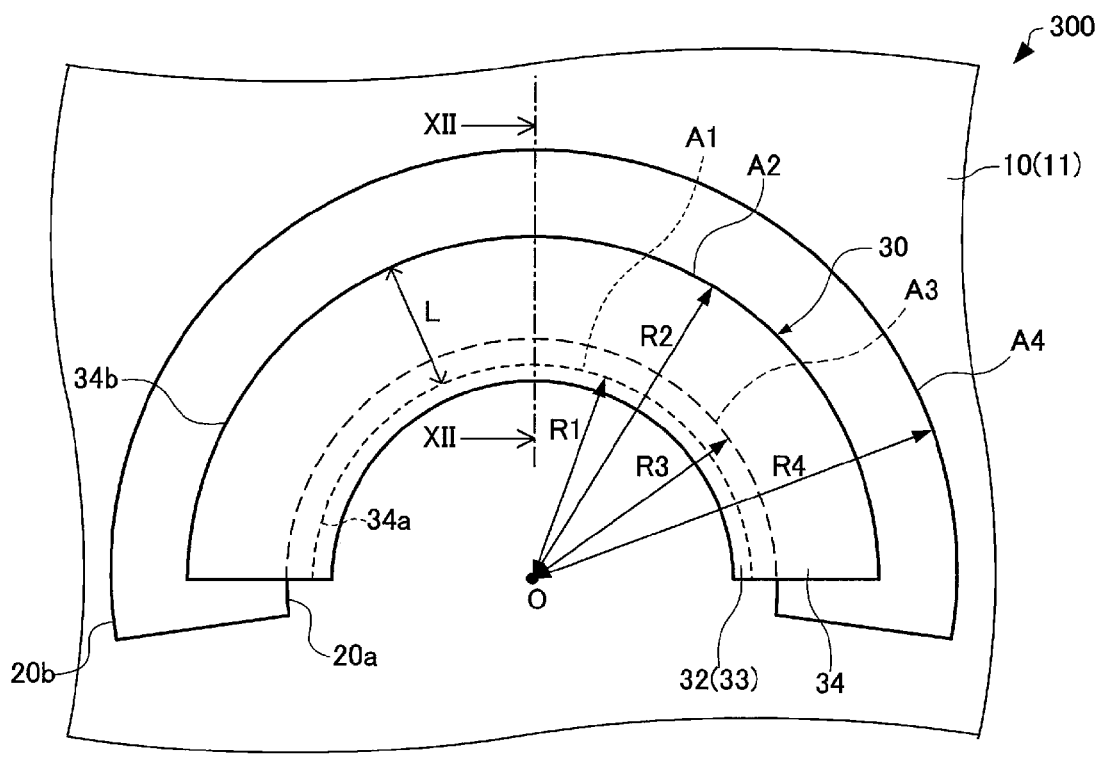
FIG. 11 is a plan view schematically showing a MEMS vibrator according to a third embodiment.
Figure 12:
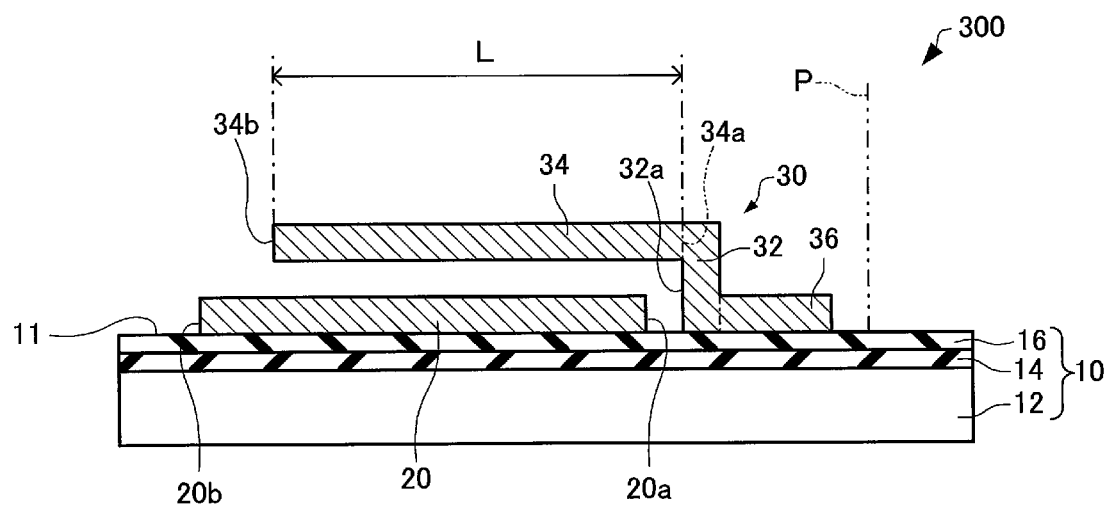
FIG. 12 is a cross-sectional view schematically showing the MEMS vibrator according to the third embodiment.

Next, a MEMS vibrator according to a third embodiment will be described with reference to the drawings. FIG. 11 is a plan view schematically showing a MEMS vibrator 300 according to the third embodiment. FIG. 12 is a cross-sectional view schematically showing the MEMS vibrator 300. FIG. 12 is the cross-sectional view taken along line XII-XII of FIG. 11. In FIG. 11, the illustration of the fixing portion 36 of the second electrode 30 is omitted for convenience sake. Hereinafter, in the MEMS vibrator 300 according to the third embodiment, members having functions similar to those of the constituent members of the MEMS vibrator 100 are denoted by the same reference numerals and signs, and the detailed descriptions thereof are omitted.

In the example of the MEMS vibrator 100, in plan view from the thickness direction of the substrate 10 as shown in FIG. 1, the first side face 20a of the first electrode 20 has the shape of the arc A3 having the third radius R3, and the second side face 20b of the first electrode 20 has the shape of the arc A4 having the fourth radius R4 smaller than the third radius R3.

In contrast to this, in the MEMS vibrator 300, in plan view from the thickness direction of the substrate 10 as shown in FIG. 11, the first side face 20a of the first electrode 20 has a shape of the arc A3 having the third radius R3, and the second side face 20b of the first electrode 20 has a shape of the arc A4 having the fourth radius R4 larger than the third radius R3.

Moreover in the example of the MEMS vibrator 100, in plan view from the thickness direction of the substrate 10 as shown in FIG. 1, the first face 34a of the second electrode 30 has the shape of the arc A1 having the first radius R1, and the second face 34b of the second electrode 30 has the shape of the arc A2 having the second radius R2 smaller than the first radius R1.

In contrast to this, in the MEMS vibrator 300, in plan view from the thickness direction of the substrate 10 as shown in FIG. 11, the first face 34a of the second electrode 30 has a shape of the arc A1 having the first radius R1, and the second face 34b of the second electrode 30 has a shape of the arc A2 having the second radius R2 larger than the first radius R1.

In the MEMS vibrator 300, the radius (first radius) R1 of the arc A1 is smaller than the other radii R2, R3, and R4 of the arcs A2, A3, and A4. The radius (second radius) R2 of the arc A2 is smaller than the radius R4 and larger than the radius R3. The radius (third radius) R3 of the arc A3 is smaller than the radius R2 and larger than the radius R1. The radius (fourth radius) R4 of the arc A4 is larger than the other radii R1, R2, and R3 of the arcs A1, A2, and A3.

According to the MEMS vibrator 300, since the supporting portion 32 has the bending portion 33 similarly to the MEMS vibrator 100, the rigidity of the beam portion 34 can be increased. Accordingly, the manufacturing error rate for the length L of the beam portion 34 can be reduced, so that the frequency shift due to the manufacturing error can be reduced.

Moreover, according to the MEMS vibrator 300, the beam portion 34 of the second electrode 30 has, in plan view from the thickness direction of the substrate 10 as shown in FIG. 11, a shape broadening from the first face 34a on the supporting portion 32 side toward the second face 34b on the tip side of the beam portion 34 (the size in a direction along the arcs A1 and A2 is increased). With this configuration, in the release etching process for removing the sacrificial layer 40 (refer to FIG. 8) described above, an etchant easily enters between the first electrode 20 and the second electrode 30 compared to, for example, the example of the MEMS vibrator 100, so that it is easy to remove the sacrificial layer 40. Accordingly, for example, the etching time can be shortened. Moreover, insufficient release can be eliminated, so that yield can be improved.

A manufacturing method of the MEMS vibrator 300 is similar to that of the MEMS vibrator 100 described above, and therefore, the description thereof is omitted.

4. Fourth Embodiment

Figure 13:
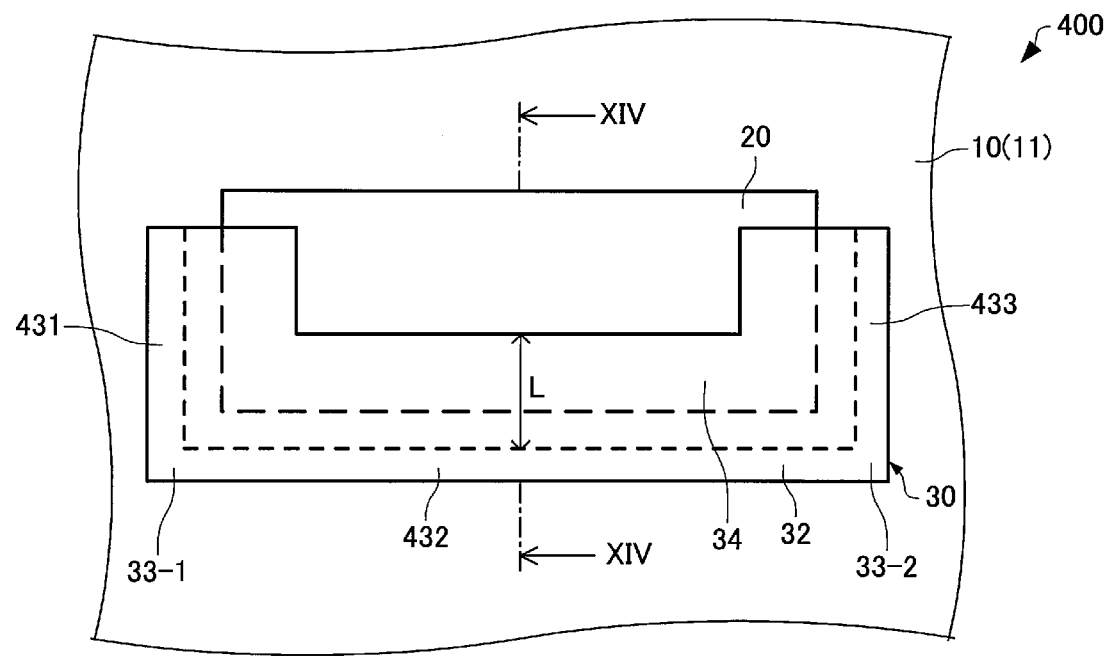
FIG. 13 is a plan view schematically showing a MEMS vibrator according to a fourth embodiment.
Figure 14:
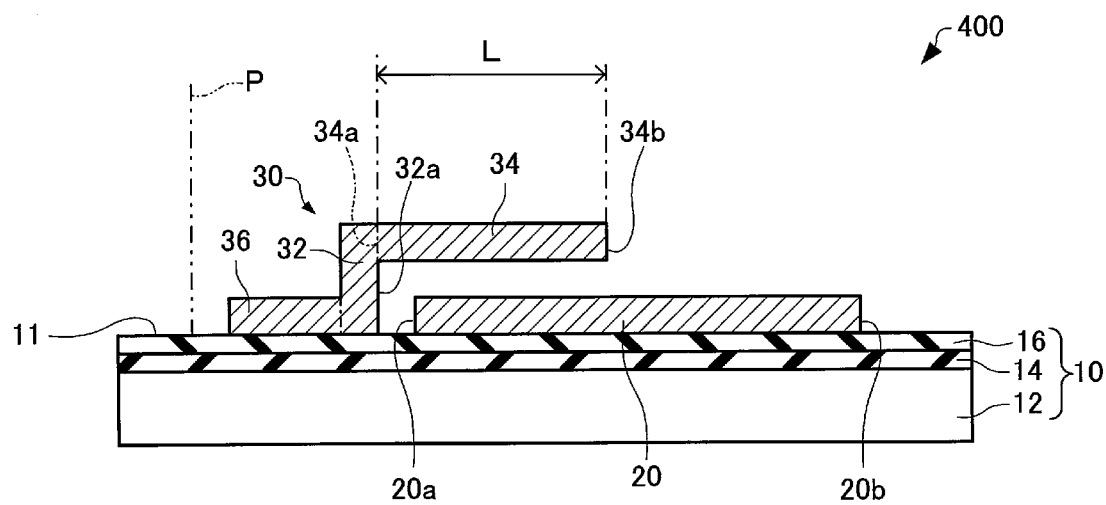
FIG. 14 is a cross-sectional view schematically showing the MEMS vibrator according to the fourth embodiment.

Next, a MEMS vibrator according to a fourth embodiment will be described with reference to the drawings. FIG. 13 is a plan view schematically showing a MEMS vibrator 400 according to the fourth embodiment. FIG. 14 is a cross-sectional view schematically showing the MEMS vibrator 400. FIG. 14 is the cross-sectional view taken along line XIV-XIV of FIG. 13. In FIG. 13, the illustration of the fixing portion 36 of the second electrode 30 is omitted for convenience sake. Hereinafter, in the MEMS vibrator 400 according to the fourth embodiment, members having functions similar to those of the constituent members of the MEMS vibrator 100 are denoted by the same reference numerals and signs, and the detailed descriptions thereof are omitted.

In the example of the MEMS vibrator 100, as for the supporting portion 32 of the second electrode 30, the entire supporting portion 32 is one bending portion 33 as shown in FIG. 1.

In contrast to this, in the example of the MEMS vibrator 400, the supporting portion 32 of the second electrode 30 has a plurality of bending portions 33 as shown in FIG. 13. In the illustrated example, the supporting portion 32 has two bending portions 33-1 and 33-2.

As shown in FIG. 13, the supporting portion 32 has a first linear portion 431, a second linear portion 432, a third linear portion 433, the first bending portion 33-1, and the second bending portion 33-2. The term "linear portion" used herein means a portion formed linearly in plan view from the thickness direction of the substrate 10. The first bending portion 33-1 connects the first linear portion 431 with the second linear portion 432, and the second bending portion 33-2 connects the second linear portion 432 with the third linear portion 433. In the illustrated example, an angle between the first linear portion 431 and the second linear portion 432 (an angle of the first bending portion 33-1) is 90°. An angle between the second linear portion 432 and the third linear portion 433 (an angle of the second bending portion 33-2) is 90°. The angle between the two linear portions (the angle of the bending portion) is not limited to this, but can be set to any angle.

The beam portion 34 extends from the bending portions 33-1 and 33-2 and the linear portions 431, 432, and 433. In other words, the side face 32a of the supporting portion 32 has bending portions having shapes corresponding to the bending portions 33-1 and 33-2, and linear portions having shapes corresponding to the linear portions 431, 432, and 433. Therefore, the beam portion 34 bends similarly to the supporting portion 32.

According to the MEMS vibrator 400, since the supporting portion 32 has the bending portions 33-1 and 33-2 similarly to the MEMS vibrator 100, the rigidity of the beam portion 34 can be increased. Accordingly, the manufacturing error rate for the length L of the beam portion 34 can be reduced, so that the frequency shift due to the manufacturing error can be reduced.

Moreover, according to the MEMS vibrator 400, since the bending portions 33-1 and 33-2 are formed at a predetermined angle (90° in the illustrated example) and not formed in a curved line (arc) like the example of the MEMS vibrator 100 for example, it is easy to design or manufacture the MEMS vibrator 400.

A manufacturing method of the MEMS vibrator 400 is similar to the manufacturing processes of the MEMS vibrator 100 described above, and therefore, the description thereof is omitted.

5. Fifth Embodiment

Figure 15:
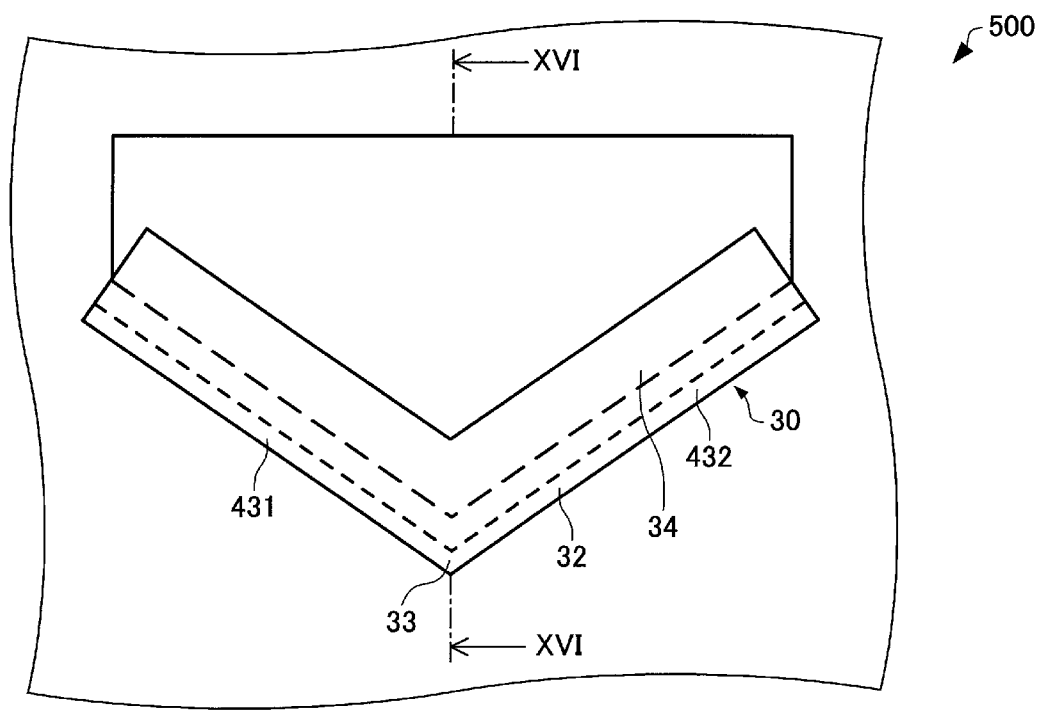
FIG. 15 is a plan view schematically showing a MEMS vibrator according to a fifth embodiment.
Figure 16:
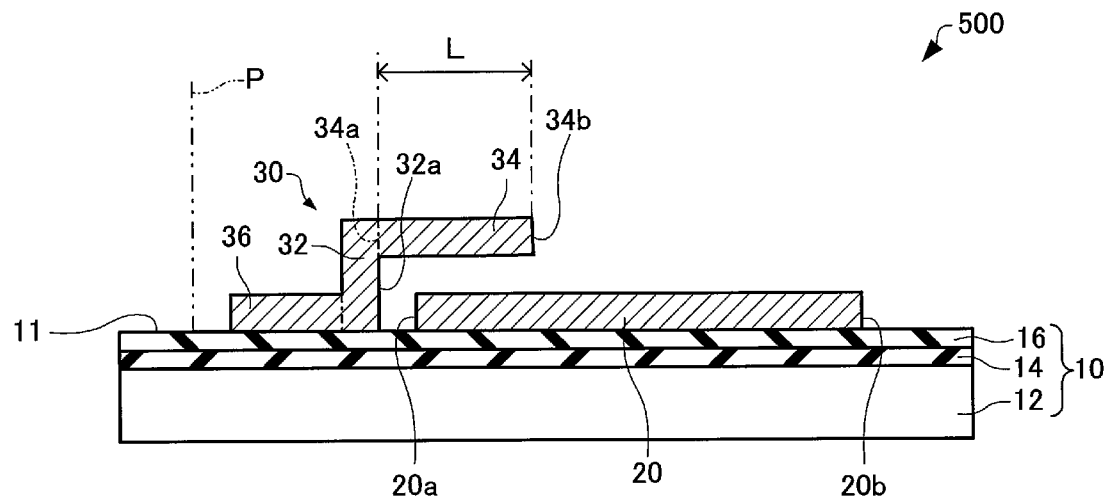
FIG. 16 is a cross-sectional view schematically showing the MEMS vibrator according to the fifth embodiment.

Next, a MEMS vibrator according to a fifth embodiment will be described with reference to the drawings. FIG. 15 is a plan view schematically showing a MEMS vibrator 500 according to the fifth embodiment. FIG. 16 is a cross-sectional view schematically showing the MEMS vibrator 500. FIG. 16 is the cross-sectional view taken along line XVI-XVI of FIG. 15. In FIG. 15, the illustration of the fixing portion 36 of the second electrode 30 is omitted for convenience sake. Hereinafter, in the MEMS vibrator 500 according to the fifth embodiment, members having functions similar to those of the constituent members of the MEMS vibrators 100 and 400 are denoted by the same reference numerals and signs, and the detailed descriptions thereof are omitted.

In the example of the MEMS vibrator 100, as for the supporting portion 32 of the second electrode 30, the entire supporting portion 32 is one bending portion 33 as shown in FIG. 1.

In contrast to this, in the MEMS vibrator 500, the beam portion 34 of the second electrode 30 has two linear portions 431 and 432 and one bending portion 33 as shown in FIGS. 15 and 16.

The bending portion 33 connects the two linear portions 431 and 432. The angle between the two linear portions 431 and 432 (the angle of the bending portion 33) is, for example, 100°. The angle between the two linear portions 431 and 432 is not limited to this, but can be set to any angle. In the illustrated example, the planar shape of the supporting portion 32 and the beam portion 34 is a V-shape. The beam portion 34 extending from the supporting portion 32 bends similarly to the supporting portion 32.

According to the MEMS vibrator 500, since the supporting portion 32 has the bending portion 33 similarly to the MEMS vibrator 100, the rigidity of the beam portion 34 can be increased. Accordingly, the manufacturing error rate for the length L of the beam portion 34 can be reduced, so that the frequency shift due to the manufacturing error can be reduced.

Moreover, according to the MEMS vibrator 500, since the bending portion 33 is formed at a predetermined angle (100° in the illustrated example) and not formed in a curved line (arc) like the example of the MEMS vibrator 100 for example, it is easy to design or manufacture the MEMS vibrator 500.

A manufacturing method of the MEMS vibrator 500 is similar to the manufacturing processes of the MEMS vibrator 100 described above, and therefore, the description thereof is omitted.

6. Sixth Embodiment

Figure 17:
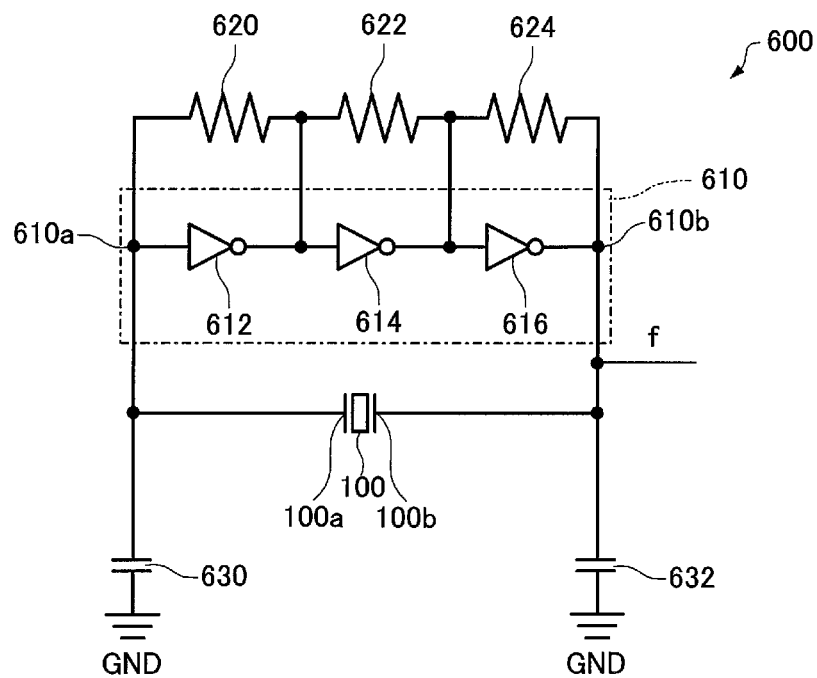
FIG. 17 is a circuit diagram showing an oscillator according to a sixth embodiment.

Next, an oscillator according to a sixth embodiment will be described with reference to the drawing. FIG. 17 is a circuit diagram showing an oscillator 600 according to the sixth embodiment.

As shown in FIG. 17, the oscillator 600 includes the MEMS vibrator (for example, the MEMS vibrator 100) according to the invention and an inverting amplifier circuit (circuit portion) 610.

The MEMS vibrator 100 has a first terminal 100a electrically connected to the first electrode 20, and a second terminal 100b electrically connected to the second electrode 30. The first terminal 100a of the MEMS vibrator 100 is at least AC-connected to an input terminal 610a of the inverting amplifier circuit 610. The second terminal 100b of the MEMS vibrator 100 is at least AC-connected to an output terminal 610b of the inverting amplifier circuit 610.

The inverting amplifier circuit 610 may be configured by combining a plurality of inverters (inverting circuits) or amplifier circuits so that a desired oscillation condition is satisfied. In the example shown in FIG. 17, the inverting amplifier circuit 610 is configured by connecting in series an inverter 612, an inverter 614, and an inverter 616 in the order from the input terminal 610a toward the output terminal 610b.

The oscillator 600 may be configured to include a feedback resistance for the inverting amplifier circuit 610. In the example shown in FIG. 17, an input terminal and an output terminal of the inverter 612 are connected via a resistance 620, an input terminal and an output terminal of the inverter 614 are connected via a resistance 622, and an input terminal and an output terminal of the inverter 616 are connected via a resistance 624.

The oscillator 600 is configured to include a first capacitor 630 connected between the input terminal 610a of the inverting amplifier circuit 610 and a reference potential (ground potential), and a second capacitor 632 connected between the output terminal 610b of the inverting amplifier circuit 610 and the reference potential (ground potential). With this configuration, it is possible to provide an oscillator circuit including a resonant circuit composed of the MEMS vibrator 100 and the capacitors 630 and 632. The oscillator 600 outputs an oscillation signal f obtained by the oscillator circuit.

Elements, such as transistors or capacitors (not shown), constituting the oscillator 600 may be formed on, for example, the substrate 10 (refer to FIG. 1). With this configuration, the MEMS vibrator 100 and the inverting amplifier circuit 610 can be formed monolithically.

When the elements, such as transistors, constituting the oscillator 600 are formed on the substrate 10, the elements, such as transistors, constituting the oscillator 600 may be formed in the same process as that of forming the MEMS vibrator 100 described above. Specifically, in the process of forming the sacrificial layer 40 (refer to FIG. 7), a gate insulating layer of the transistors may be formed. Further, in the process of forming the second electrode 30 (refer to FIG. 8), gate electrodes of the transistors may be formed. In this manner, the manufacturing processes are commonly used for the MEMS vibrator 100 and for the elements, such as transistors, constituting the oscillator 600, whereby the manufacturing processes can be simplified.

According to the oscillator 600, the MEMS vibrator 100 having high frequency accuracy is included. Therefore, the oscillator 600 can output signals having high frequency accuracy.

Figure 18:
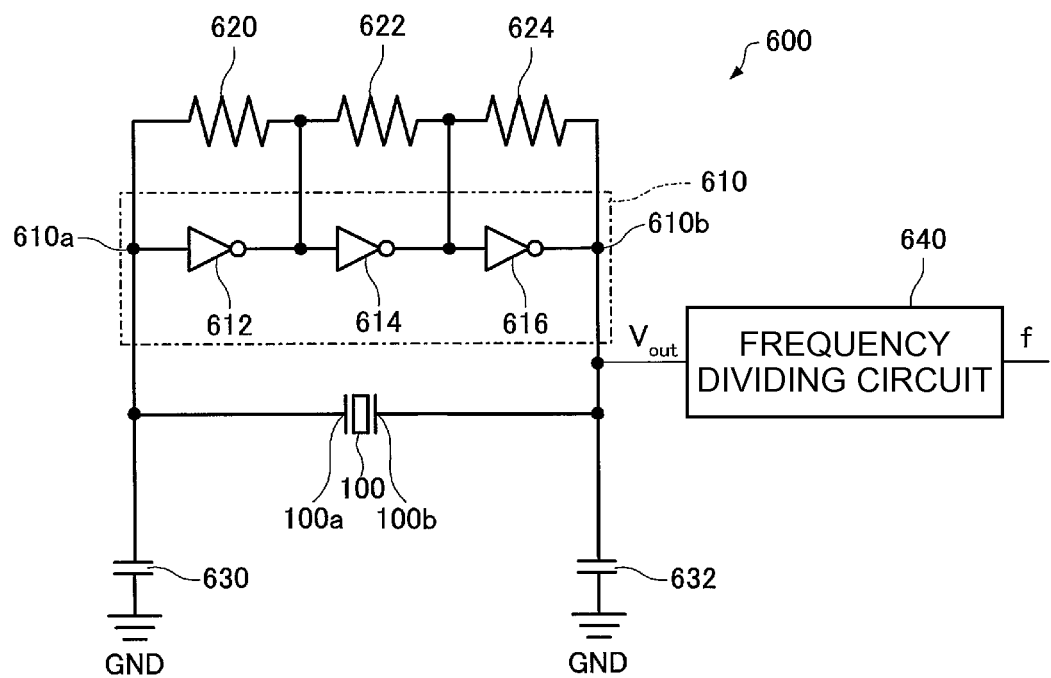
FIG. 18 is a circuit diagram showing an oscillator according to a modified example of the sixth embodiment.

As shown in FIG. 18, the oscillator 600 may further have a frequency dividing circuit 640. The frequency dividing circuit 640 divides an output signal $V_{out}$ of the oscillator circuit, and outputs the oscillation signal f. With this configuration, the oscillator 600 can obtain, for example, an output signal at a frequency lower than that of the output signal $V_{out}$.

The embodiments and modified examples described above are illustrative only, and the invention is not limited to them. For example, a plurality of the embodiments and the modified examples can be combined appropriately.

The invention includes a configuration (for example, a configuration having the same function, method, and result, or a configuration having the same advantage and effect) which is substantially the same as those described in the embodiments. Moreover, the invention includes a configuration in which a non-essential portion of the configurations described in the embodiments is replaced. Moreover, the invention includes a configuration providing the same operational effects as those described in the embodiments, or a configuration capable of achieving the same advantages. Moreover, the invention includes a configuration in which a publicly known technique is added to the configurations described in the embodiments.

The entire disclosure of Japanese Patent Application No. 2011-164378, filed Jul. 27, 2011 is expressly incorporated by reference herein.

What is claimed is:

1. A micro electro mechanical system vibrator comprising:
    a substrate;
    a first electrode disposed above the substrate; and
    a second electrode disposed in a state where at least one portion of the second electrode has a space between the first electrode and the second electrode, and having a beam portion capable of vibrating, in a thickness direction of the substrate, with electrostatic force and a supporting portion supporting one edge of the beam portion and disposed above the substrate, wherein
    a supporting side face of the supporting portion supporting the one edge has a bending portion which bends in a plan view,
    the bending portion is in an arc shape in the plan view, and
    the one edge is supported by the supporting side face including the bending portion.

2. The micro electro mechanical system vibrator according to claim 1, wherein
    the one edge is in an arc shape having a first radius in the plan view, and
    the other edge of the beam portion is in an arc shape having a second radius smaller than the first radius in the plan view.

3. The micro electro mechanical system vibrator according to claim 2, wherein
    the first electrode has
        a first side face facing the supporting side face of the supporting portion, and
        a second side face located on a side opposite to the first side face and having a shape along the first side face,
    the first side face is in an arc shape having a third radius smaller than the first radius and larger than the second radius in the plan view, and
    the second side face is in an arc shape having a fourth radius smaller than the second radius in the plan view.

4. The micro electro mechanical system vibrator according to claim 1, wherein
    the first electrode has a first side face facing the supporting side face of the supporting portion, and
    the first side face has a shape along the supporting side face of the supporting portion.

5. The micro electro mechanical system vibrator according to claim 1, wherein
    the supporting side face of the supporting portion further has a linear portion in the plan view.

6. An oscillator comprising:
    the micro electromechanical system vibrator according to claim 1, and
    a circuit portion electrically connected to the first electrode and the second electrode of the micro electro mechanical system vibrator.

* * * * *